United States Patent [19]

Baigetsu

[11] Patent Number: 5,080,763
[45] Date of Patent: Jan. 14, 1992

[54] METHOD OF FORMING CONDUCTOR LINES OF A SEMICONDUCTOR DEVICE

[75] Inventor: Aiichirou Baigetsu, Kyoto, Japan

[73] Assignee: Fujitsu Limited, Kawasaki, Japan

[21] Appl. No.: 533,641

[22] Filed: Jun. 5, 1990

[30] Foreign Application Priority Data

Jun. 6, 1989 [JP] Japan .................... 1-143397

[51] Int. Cl.$^5$ .................................. C25D 5/02
[52] U.S. Cl. ............................ 205/95; 205/125; 205/266
[58] Field of Search ................... 204/15, 47.5

[56] References Cited

U.S. PATENT DOCUMENTS 4,767,507  8/1988  Wilkinson .................. 204/47.5

FOREIGN PATENT DOCUMENTS 60-29483  2/1985  Japan .

Primary Examiner—T. M. Tufariello
Attorney, Agent, or Firm—Armstrong, Nikaido, Marmelstein, Kubovcik & Murray

[57] ABSTRACT

A method of forming conductor lines of a semiconductor device comprises a step of depositing (electroplating) a gold (Au) layer on an underlying barrier conductive layer in a gold plating bath. According to the present invention, the plating bath is supplemented with an additive in amount such that a lead (iron or nickel) concentration of the bath is form 0.7 to 10 ppm, whereby a deposition rate of the gold near a patterned resist layer is lowered, in comparison with that at the center part of the uncovered conductive layer. The gold plated layer has round edges at the both corners thereof, and therefore, when a protective insulating layer is formed over the gold plated layer, the round edges improve the step coverage of and prevent the appearance of cracks in the protective layer.

9 Claims, 5 Drawing Sheets

METHOD OF FORMING CONDUCTOR LINES OF A SEMICONDUCTOR DEVICE

BACKGROUND OF THE INVENTION

1. Field of the Invention

The present invention relates to a method of forming conductor lines of a semiconductor device, and more particularly, to a method of electroplating a gold (Au) layer on an underlying conductive layer for the conductor lines.

As a step toward the miniaturization thereof, a semiconductor integrated circuit device is provided with fine patterned conductor lines, but to enable a relatively large electric current to be passed through these conductor lines, they should be made thicker.

2. Description of the Related Art

To form conductor lines being relatively thick, an electroplating technique of gold has been adopted as shown, for example, in FIGS. 1A to 1E illustrating a formation of the gold conductor lines.

As shown in FIG. 1A, in accordance with a conventional producing technique, a $SiO_2$ layer 2 is formed on a Si substrate 1, Al conductor lines 3 are formed on the $SiO_2$ layer 2, and then an insulating (e.g., PSG) layer 4 is formed thereover. Contact holes 5 are formed in the insulating layer 4 by a conventional lithography process, and a double-layer barrier metal (conductive) layer 6 composed of a titanium (Ti) layer and a palladium (Pd) layer is formed over the insulating layer 4 and the Al conductor layer 3 exposed within the contact holes 5. Thereafter, a photo-sensitive resin is deposited on the barrier metal layer 6 by a spin-coating method, to form a resist layer 7.

As shown in FIG. 1B, the resist layer 7 is selectively exposed by a light, an electron beam or the like, and then developed to form openings 8 having the same shape as the conductor lines 3 and covering the contact holes 5. Namely, the resist layer 7 is suitably patterned.

Then, as shown in FIG. 1C, gold is deposited on the barrier layer 6 within the openings 8, in a gold plating bath by an electroplating technique, to form a gold layer 9a, 9b having a thickness of, e.g., 5 $\mu$m. The barrier layer 6 is connected to a cathode terminal of an electric power source to serve as a cathode electrode and an anode electrode of, e.g., platinum or the like is connected to an anode terminal of the power source.

As shown in FIG. 1D, the patterned resist layer 7 is then removed, and using the gold plated layer 9a and 9b as a mask, the barrier (Ti/Pd) layer 6 is selectively etched by a suitable wet-etching process to finally form conductor lines 10 composed of the gold plated layer 9a, 9b and the patterned barrier layer 6.

At a next step of a production of a semiconductor device, as shown in FIG. 1E, a protective (passivation) insulating layer 11 is formed over the whole surface of the conductor lines 10 and the insulating layer 4. The protective layer 11 is usually made of an insulating material such as PSG, $Si_3N_4$, is deposited by a chemical vapor deposition (CVD) process, a sputtering process or the like, and has a thickness of from 1 to 2 $\mu$m.

As can be seen in FIG. 1E, the gold plated layer 9a, 9b has sharp edges at the almost right angle corners thereof, and there is a large step between the top surface of the conductor lines 10 and the surface of the insulating layer 4, having a height of, e.g., about 6 $\mu$m, as shown in FIG. 1D. Accordingly, when the protective layer 11 is formed, these sharp edges and the large step adversely affect the step coverage of the formed layer 11. For example, the thickness of the protective layer 11 is reduced at the sharp edges, as shown in FIG. 1E; in the worst state, the protective layer 11 is separated by the sharp edges, and thus the conductor lines 10 are not fully covered. Furthermore, the sharp edges increase the stress concentration, which will cause the appearance of cracks 12. If the distance between the adjacent conductor lines 10 is narrow, as shown in FIG. 2, the protective layer 11 may form a porosity (pipe) 13 because the top portions thereof are extended toward the center of the gap between the conductor lines 10 and joined together at that point. In this case, when a rise of an ambient temperature occurs, the gas in the porosity 13 is expands and causes cracks 14 to appear in the protective layer 11 surrounding the porosity 13. Such an adverse step coverage and the appearance of cracks lowers the reliability of the semiconductor device.

SUMMARY OF THE INVENTION

An object of the present invention is to provide a method of forming conductor lines of a semiconductor device by which the step coverage of a protective insulating layer formed on the conductor lines is improved and the appearance of cracks in the protective layer is prevented.

Another object of the present invention is to increase the reliability of the semiconductor device.

These and other objects of the present invention are obtained by providing a method of forming conductor lines of a semiconductor device comprising the steps of: forming a conductive layer over an insulating layer on a semiconductor substrate; coating the conductive layer with a patterned resist layer; depositing a gold layer on an uncovered portion of said conductive layer which is connected to a cathode terminal of a power source, in a plating bath in accordance with an electroplating process; removing the resist layer; and selectively etching the conductive layer by using the gold plated layer as a mask to form the conductor lines consisting of the gold plated layer and the conductive layer. According to the present invention, the plating bath is supplemented with an additive which lowers a deposition rate of the gold near the resist layer, in comparison with that at the center part of the uncovered portion of the conductive layer.

Further, according to the present invention, the additive in the plating bath causes a sloping of corners of the gold plated layer, from the thickest portion at the center part thereof to the thinnest portion thereof in contact with the resist layer wall. As a result, the edges of the gold plated layer are rounded at both corners thereof, to thereby improve the step coverage of a protective (covering) layer and prevent the appearance of cracks in the protective layer.

Namely, the larger a ratio (x/h) of a curvature (x) of the round edges of the gold plated layer to a thickness (h) of the gold plated layer, the better the step coverage of the protective layer formed on the gold plated layer. The ratio (x/h) depends on the metal concentration (of Pb, Fe or Ni) in the plating bath. For example, at a lead concentration of 0.7 ppm, the ratio (x/h) is about 0.3 and the step coverage is thereby improved. If the lead concentration is more than 5 ppm, the ratio is relatively lower, and where the lead concentration is more than 10 ppm, the gold purity is lowered and an electromigration of gold plated lines is liable to occur. Therefore, preferably the metal (lead) concentration of the gold plating bath is from 2 to 7 ppm.

BRIEF DESCRIPTION OF THE DRAWINGS

The features of the present invention will be made more apparent by the description of the preferred embodiments set forth below with reference to the accompanying drawings, in which.

DESCRIPTION OF THE PREFERRED EMBODIMENTS

Figure 4:
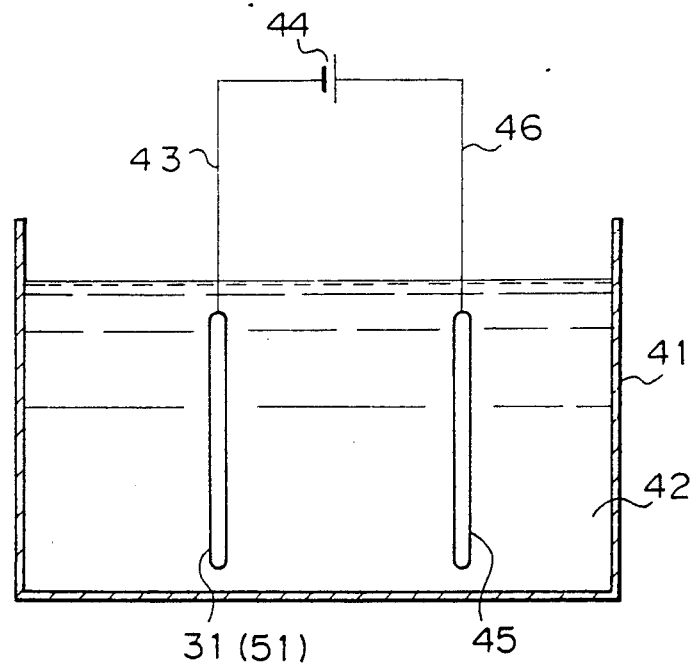
FIG. 4 is a schematic sectional view of a gold plating apparatus.
Figure 3A:
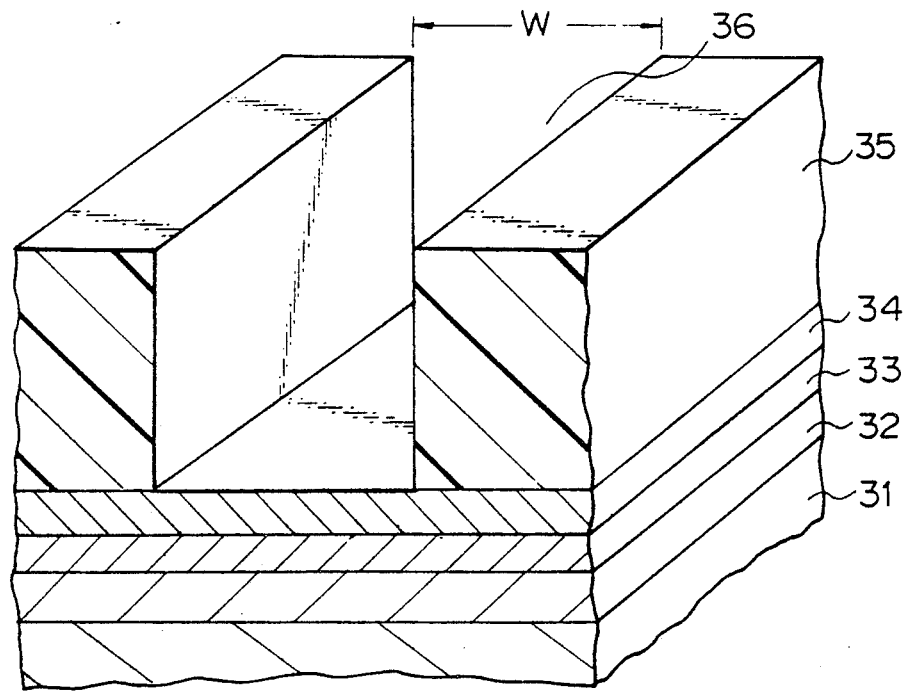
FIG. 3A is a sectional perspective view of a semiconductor device before the gold plating is effected.
Figure 3B:
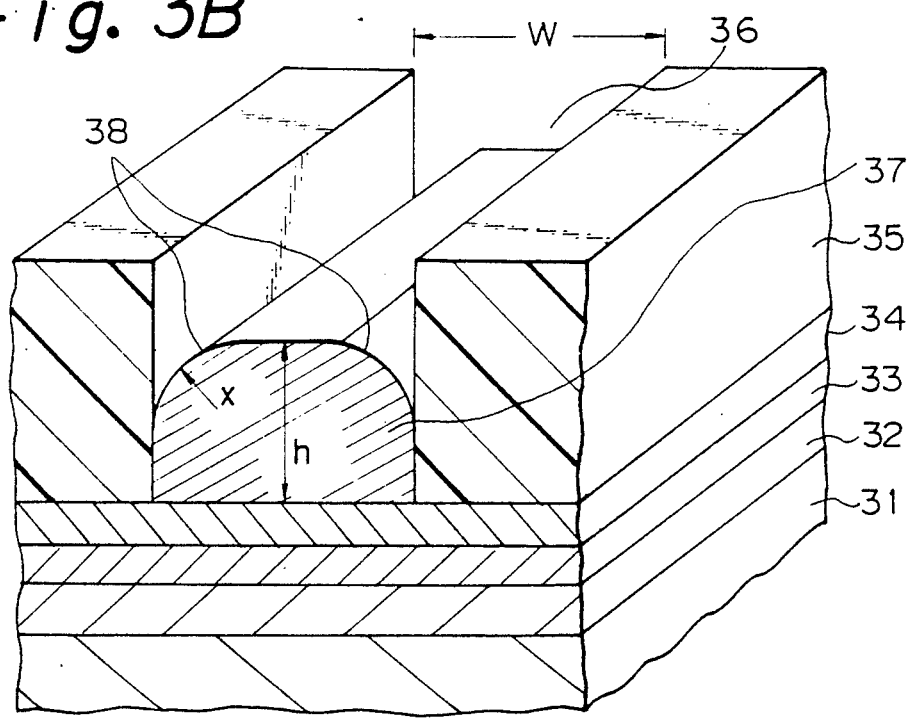
FIG. 3B is a sectional perspective view of a semiconductor device after the gold plating is effected in accordance with the present invention.

As shown in FIGS. 3A, 3B and 4, the present inventor carried out the following experiments with regard to the gold plating process, and found that the corners of a gold plated layer forming conductor lines of a semiconductor device can be made round.

As shown in FIG. 3A, in accordance with a conventional production process for a semiconductor device, a $SiO_2$ layer 32 was formed on a semiconductor (silicon) substrate 31, an aluminum layer 33 corresponding to first conductor lines was formed on the $SiO_2$ layer 32, a barrier conductive layer 34 composed of a titanium layer and a palladium layer thereon was formed on the aluminum layer 33, and then a photoresist layer 35 was deposited on (coated) the barrier conductive layer 34. The photoresist layer 35 was made of a negative photoresist of BMR-SF1000 (trade name of a product made by Tokyo-Ohka Kogyo Co., Ltd.). The photoresist layer 35 had a thickness of 10 μm, and an opening 36 having a width (W) of 10 μm was formed therein by exposing and developing same.

A gold plating solution of TEMPERESIST-K91S (trade name of a product made by Nihon Kojundo Kagaku Co. Ltd.), which did not contain lead and cyanide, was poured in a vessel 41 and a lead nitride solution was added thereto to obtain a predetermined lead concentration of a gold plating bath 42 in FIG. 4. The noncyanide gold plating TEMPERESIST-K91S contained at least gold sodium sulfite, a complexing agent, and conductive salts. The plating bath 42 was kept at a temperature of 75° C. and at a pH of 7.2 to 7.4.

The barrier layer 34 was connected by a wiring 43 to a negative terminal of an electric power source 44, and then the substrate 31 covered with the above-mentioned layers 32 to 35 was immersed in the bath 42. Thereafter, an anode electrode 45 of platinum (Pt) connected to a positive terminal of the power source 44 through a wiring 46 was immersed in the bath 42.

Under the above-mentioned conditions, an electric current having a current density of 4 $mA/cm^2$ at a source voltage of 1 V was passed through the barrier conductive layer 34, the bath 42 and the anode electrode 45, for 20 minutes, to deposit gold (Au) on the barrier conductive layer 34, whereby a gold plated layer 37 was formed as shown in FIG. 3B. The gold plated layer 37 had round edges 38 at both corners thereof, a curvature (x) of which depended on the lead concentration as shown in Table 1 and FIG. 5. The thickness (h) of the gold plated layer 37 at the center of the opening 36 was a constant value of 5 μm, regardless of variations of the lead concentration.

TABLE 1

| LEAD CONCENTRATION (ppm) | RATIO OF CURVATURE TO THICKNESS (x/h) |
| --- | --- |
| 0.06 | 0.02 |
| 0.38 | 0.08 |
| 0.72 | 0.31 |
| 1.44 | 0.43 |
| 2.14 | 0.48 |
| 4.92 | 0.50 |
| 7.05 | 0.51 |

Figure 5:
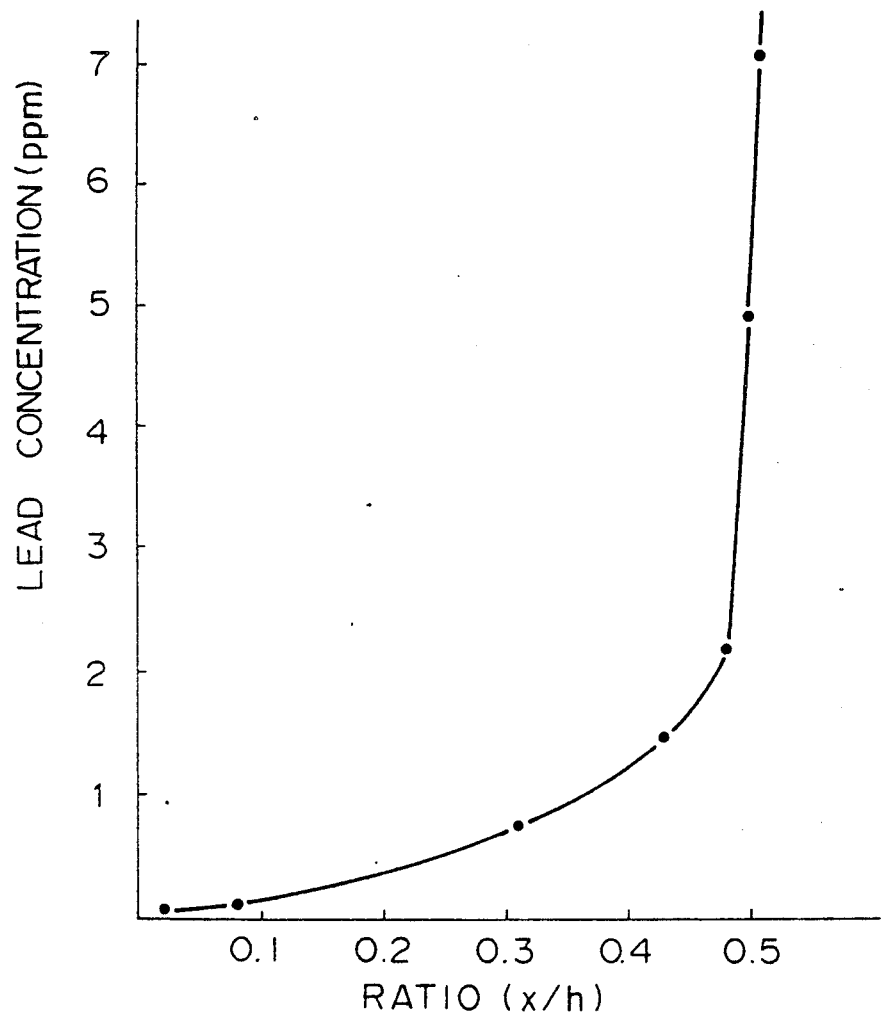
FIG. 5 is a graph showing a relationship between a lead concentration of a plating bath and a ratio (x/t) of a curvature (x) of round edges of a gold plated layer to a thickness (h) of the gold plated layer.

As can be seen from Table 1 and FIG. 5, as the lead concentration (ppm) of the gold plating bath was increased, the ratio (x/h) of the curvature of the round edges to the gold plated layer thickness (h) was increased, but was not substantially increased at a lead concentration of over 5 ppm. Where the plating bath did not contain lead or contained very little lead, the gold plated layer had sharp, right angled edges at the corners thereof.

Where iron (Fe) or nickel (Ni) is used instead of lead, the same effects occur as obtained from the lead.

Referring to FIGS. 6A to 6E, a semiconductor device having conductor lines formed thereon in accordance with the present invention is produced in the following manner.

Figure 6A:
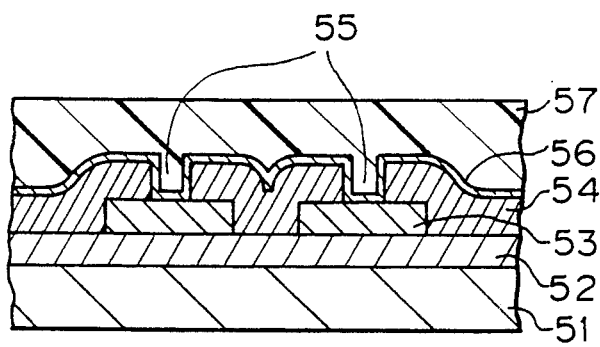
FIGS. 6A to 6E are schematic sectional views of a semiconductor device at various stages in the formation of conductor lines in accordance with the present invention.

As shown in FIG. 6A, a semiconductor substrate (silicon single crystalline wafer) 51 is prepared and is thermally oxidized to form an insulating $SiO_2$ layer 52. Then an aluminum layer having a thickness of 1.3 μm is deposited on the $SiO_2$ layer 52 by a sputtering process and is selectively etched in accordance with a conventional photolithography process to form Al conductor lines 53. The whole of the $SiO_2$ layer 52 and the Al conductor lines 53 is then covered by an insulating PSG layer 54 having a thickness of 1.0 μm and deposited by a CVD process. Thereafter, the PSG layer 54 is selectively etched by a conventional photolithography process to form contact holes 55 in which parts of the Al conductor lines 53 are exposed, and then the whole of the PSG layer 54 and the exposed Al lines 53 is coated with a barrier conductive layer 56 formed by successively depositing a titanium lower layer having a thickness of 500 nm and a palladium upper layer having a thickness of 300 nm thereon by a continuous sputtering process. A photoresist (BMR-SF1000) is then deposited on (coats) the barrier conductive layer 56, by a spin-coating process, to form a resist layer 57 having a thickness of 10 μm.

Figure 1A:
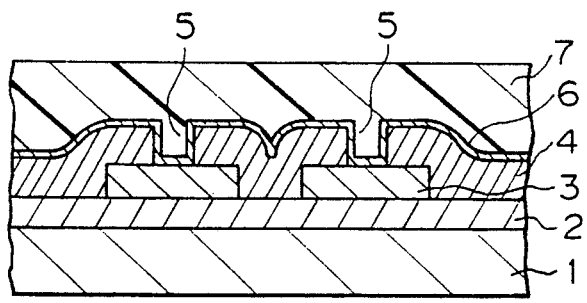
FIGS. 1A to 1E are schematic sectional views of a semiconductor device in various stages of the formation of conductor lines according to the prior art.
Figure 1B:
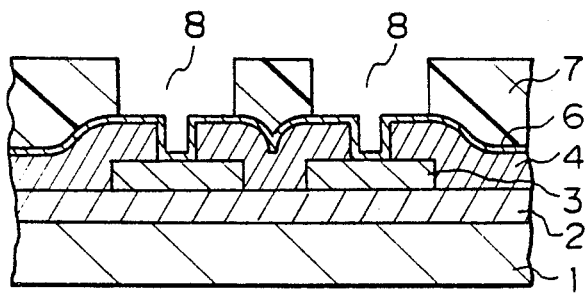
Figure 1C:
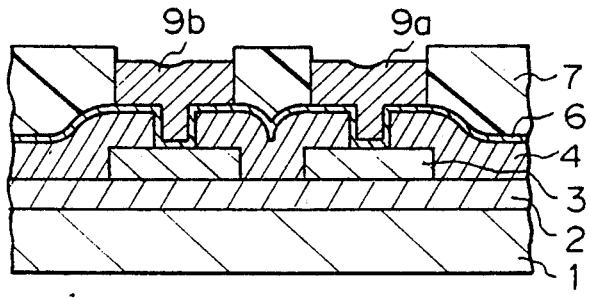
Figure 1D:
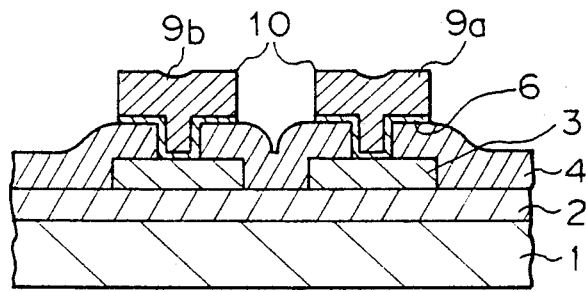
Figure 1E:
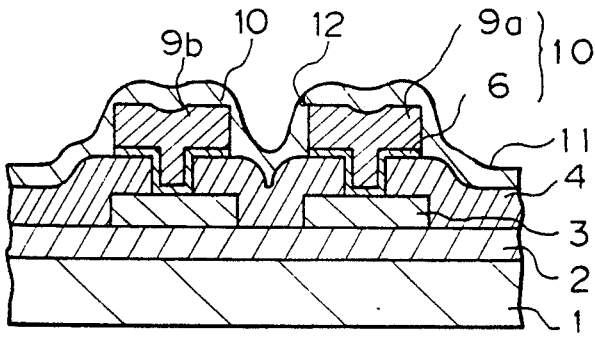
Figure 2:
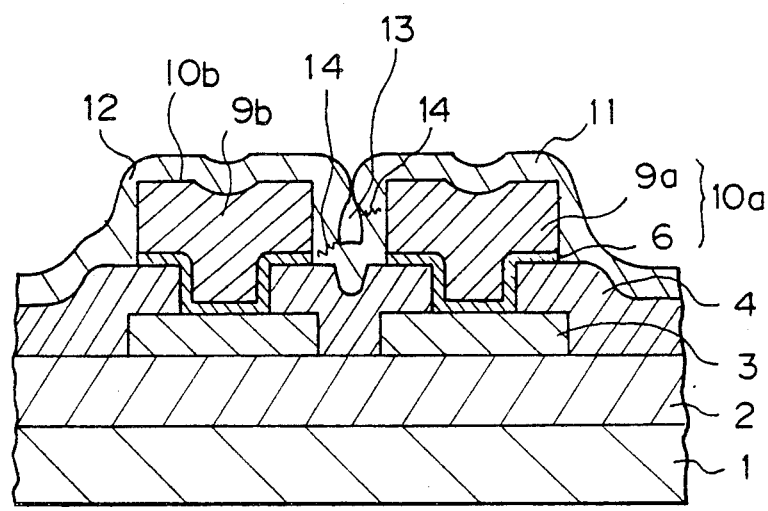
FIG. 2 is a schematic sectional view of a semiconductor device in which the conductor liners are close to each other.
Figure 6B:
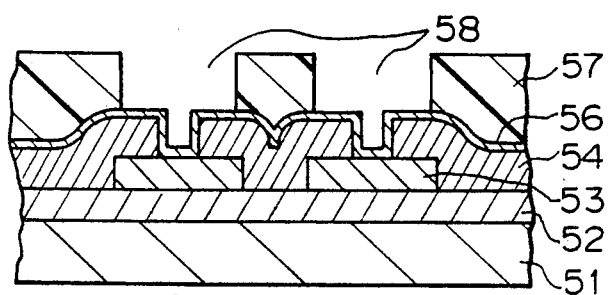

As shown in FIG. 6B, the resist layer 57 is exposed to a patterning light and the unexposed parts thereof are then removed by a developer to form openings 58 having a predetermined conductor line pattern and covering the contact holes 55. The obtained structure as shown in FIG. 6B is almost the same as that shown in FIG. 1B.

Figure 6C:
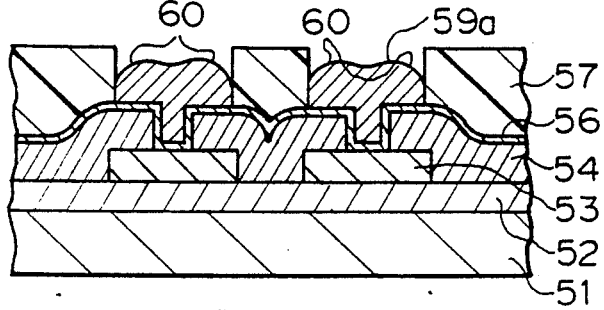

To deposit gold on the uncovered (unexposed) parts of the barrier conductive layer 56 in a plating bath 42 as shown in FIG. 4, the layer 56 is connected to a wire 43 and the substrate 51 covered with the layers 52, 53, 54, 56 and 57 is immersed in the bath 42. The gold plating base 42 consists of a commercially available noncyanide system plating solution (i.e., TEMPERESIST-K91S) containing at least gold sodium sulfite, a complexing agent, conductive salts, and a additive (a lead nitrate solution) to an amount such that a lead (Pb) concentration of the bath is 5 ppm. The bath 42 is heated to and maintained at 75° C. prior to the immersion of the substrate 51, and an anode electrode 45 of platinum connected to another wire 46 is immersed in the bath 42. The wires 43 and 46 are connected to a negative terminal and a positive terminal of a power source 44, respectively, and the source 44 is turned ON to pass a current of 5 mA (at a current density of 4 mA/cm$^2$) through the barrier conductive layer 56, the bath 42, and the anode electrode 45 at a voltage of 1 V for 20 minutes. As a result, a gold plating process progresses under the conditions of a lower deposition rate of the gold near the resist layer 57 and a higher deposition rate thereof at the center of the uncovered part of the barrier conductive layer 56, to thereby form a gold plated layer 59a and 59b having a thickness (h) of 5 μm on the barrier layer 56 and within the openings 58, as shown in FIG. 6C. The formed gold layer 59a and 59b has round edges 60 having a curvature (x) of 2.5 μm.

Figure 6D:
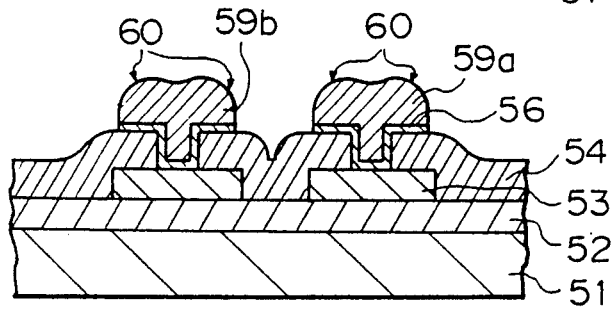

Then, as shown in FIG. 6D, the resist layer 57 is removed. Then, using the gold plated layer 59a and 59b as a mask, the upper palladium layer of the barrier conductive layer 56 is selectively etched with equa regia, and successively, the lower titanium layer is selectively etched with a solution of a mixture of $H_2O_2$ and $NH_3OH$. Accordingly, conductor lines 61a and 61b composed of the gold plated layer 59a (and 59b) and the patterned barrier conductive layer 56 are formed.

Figure 6E:
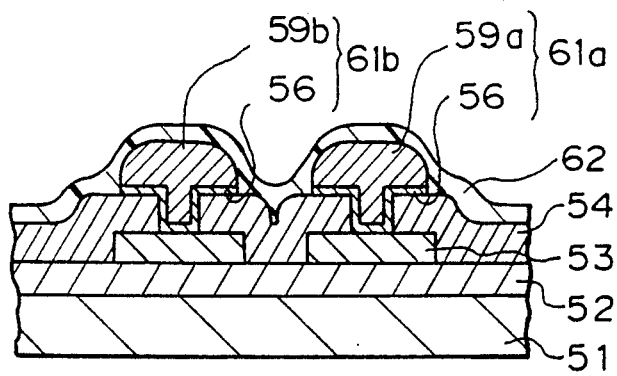

Thereafter, as shown in FIG. 6E, the whole of the conductor lines 61a and 61b and the insulating PSG layer 54 is covered with a protective (covering) insulating layer 62, which is formed by depositing a PSG layer having a thickness of 1.0 μm, and successively, a $Si_3N_4$ layer having a thickness of 0.3 μm thereon by a CVD process, and thus a semiconductor device is produced.

When the protective layer 62 is formed, since the conductive lines 61a and 62b (i.e., gold plated layer 59a and 59b) have round edges 60 at both corners thereof, the protective layer 62 provides a better step coverage than in the conventional case. The round edges 60 do not cause cracks 12, 14 to appear in the protective layer 62 (11), and further prevent the formation of a porosity (pipe) 13. Therefore, the conductor lines formed in accordance with the present invention prevent any lowering of the reliability of the protective covering layer, i.e., improve the reliability of a semiconductor device compared with the conventional case.

It will be obvious that the present invention is not restricted to the above-mentioned embodiments and that many variations are possible for persons skilled in the art without departing from the scope of the invention. For example, it is possible to use any mixture of lead, iron and nickel instead of the use of each of metal alone. It is also possible to use a cyanide system gold plating solution containing lead (iron or nickel) within the above-mentioned concentration range, instead of the noncyanide plating solution.

I claim:

1. A method of forming conductor lines having rounded shoulders of a semiconductor device comprising the steps of:
    forming a conductive layer over a semiconductor substrate;
    coating the conductive layer with a patterned resist layer;
    connecting the conductive layer to a cathode terminal of a power source, and
    differentially depositing a gold layer on an uncovered portion of said conductive layer, said uncovered portion having a middle and at least two edges, such that the gold layer is thicker toward the middle of the uncovered portion than at the edges, by using a plating bath in accordance with an electroplating process, said plating bath is supplemented with an additive in an effective amount which lowers a deposition rate of the gold near said resist layer, in comparison with the deposition rate thereof at the center part of said uncovered portion of said conductive layer,
    wherein said additive is a solution containing a metal selected from the group consisting of lead, iron, and nickel.

2. A method for forming conductor lines according to claim 1, wherein said metal is added in an amount needed to provide a metal concentration in said plating bath of from 0.7 to 10 ppm.

3. A method according to claim 2, wherein said metal is lead.

4. A method according to claim 3, wherein said lead concentration is from 2 to 7 ppm.

5. A method according to claim 3, wherein said solution contains lead nitrate.

6. A method according to claim 1, wherein said plating bath is a noncyanide system bath.

7. A method according to claim 1, wherein said patterned resist layer is formed by applying a resin layer on said conductive layer, selectively exposing the resin layer, and then developing the resin layer.

8. A method according to claim 1, further comprising, after said electroplating step, steps of removing said resist layer; selectively etching said conductive layer by using the gold plated layer as a mask to form the conductor lines consisting of said gold plated layer and the conductive layer; and forming a protective layer over the whole surface of the conductor lines and the insulating layer.

9. A method according to claim 1, wherein said conductive layer is in contact with conductor lines underlying said insulating layer through contact holes formed in the insulating layer.

* * * * *